United States Patent
Kumagai et al.

[11] Patent Number: 6,147,573
[45] Date of Patent: Nov. 14, 2000

[54] MULTILAYER ELECTRONIC PART WITH PLANAR TERMINAL ELECTRODES

[75] Inventors: Shuumi Kumagai; Kouzou Sasaki; Makoto Kobayashi; Noriyuki Saito; Hisayuki Abe; Toru Takahashi; Kenji Shibata, all of Akita, Japan

[73] Assignee: TDK Corporation, Tokyo, Japan

[21] Appl. No.: 08/975,458

[22] Filed: Nov. 21, 1997

[30] Foreign Application Priority Data

| Nov. 21, 1996 | [JP] | Japan | 8-310310 |
| May 7, 1997 | [JP] | Japan | 9-117306 |
| Oct. 17, 1997 | [JP] | Japan | 9-284164 |

[51] Int. Cl.⁷ ................................. H03H 7/01
[52] U.S. Cl. ........................... 333/185; 336/200
[58] Field of Search ..................... 333/184, 185; 336/200, 232

[56] References Cited

U.S. PATENT DOCUMENTS

| 3,812,442 | 5/1974 | Muckelroy | 336/200 |
| 3,833,872 | 9/1974 | Marcus et al. | 336/200 X |
| 5,302,932 | 4/1994 | Person et al. | 336/200 |
| 5,392,019 | 2/1995 | Ohkubo | 333/185 X |
| 5,497,137 | 3/1996 | Fujiki | 336/200 |
| 5,880,662 | 3/1999 | Person et al. | 336/200 |

FOREIGN PATENT DOCUMENTS

| 58-21807 | 2/1983 | Japan . |
| 2-44309 | 3/1990 | Japan . |
| 4-242911 | 8/1992 | Japan . |
| 4-302410 | 10/1992 | Japan . |
| 8-55726 | 2/1996 | Japan . |

OTHER PUBLICATIONS

Patent Abstracts of Japan, vol. 096, No. 006, Jun. 28, 1996, JP 08–055 726, Feb. 27, 1996.

*Primary Examiner*—Justin P. Bettendorf
*Attorney, Agent, or Firm*—Oblon, Spivak, McClelland, Maier & Neustadt, P.C.

[57] ABSTRACT

A multilayer electronic part having the shape of a substantially rectangular parallelopiped is constituted which has a multilayer body formed by superposing coil conductors and green sheets of a magnetic or nonmagnetic material. Terminal electrodes are formed respectively on both ends of the multilayer body along the direction of the magnetic flux generating when current is caused to flow through the coil conductors in the multilayer body. The terminal electrodes each has a conductive substrate formed within the area of the end of the multilayer body and consisting of a lamination body as a component of the multilayer body.

10 Claims, 13 Drawing Sheets

FIG. 1F

| | LEADING OUT CONDITION | REACTANCE FLUCTUATION RATIO (NOMINAL VALUE : 3.3nH) |
|---|---|---|
| A CASE WHERE THE SPIRAL INITIATION POSTITION "a" AND THE SPIRAL INITIATION POSITION "B" ARE LOCATED ON THE DIAGONAL LINE, NEAR CORNERS, SYMMETRICALLY ABOUT THE CENTER OF THE SECTION OF THE MULTILAYER BODY 24. | 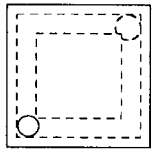 | 2.20% |
| A CASE WHERE THE POSITIONS "a" AND "b" ARE LOCATED AT THE CENTER OF THE SECTION OF THE MULTILAYER BODY 24. | 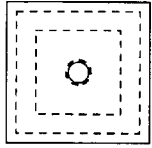 | 1.86% |
| A CASE WHERE THE POSITIONS "a" AND "b" ARE LOCATED ON THE DIAGONAL LINE, AT THE INSIDE OF THE SPIRAL PORTION OF THE COIL, AND SYMMETRICALLY ABOUT THE CENTER OF THE SECTION OF THE MULTILAYER BODY 24. | 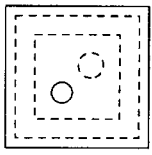 | 2.05% |
| A CASE WHERE THE POSITIONS "a" AND "b" ARE LOCATED SYMMETRICALLY ABOUT THE CENTER OF THE SECTION OF THE MULTILAYER BODY 24, AND ON THE VERTICAL OR HORIZONTAL CENTER LINE OF THE SECTION. | 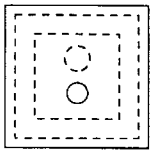 | 2.04% |
| A CASE WHERE THE POSITIONS "a" AND "b" ARE LOCATED AT A CORNER OF THE SECTION, AND CORRESPOND TO EACH OTHER. | 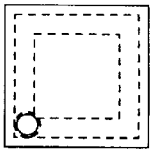 | 3.92% |

○ : LEADING OUT INITIATION PORTION (SPIRAL INITIATION POINT "a")
◌ : LEADING OUT TERMINATION PORTION (SPIRAL TERMINATION POINT "b")
---- : COIL CONDUCTOR SPIRAL PORTION

FIG. 10A
PRIOR ART
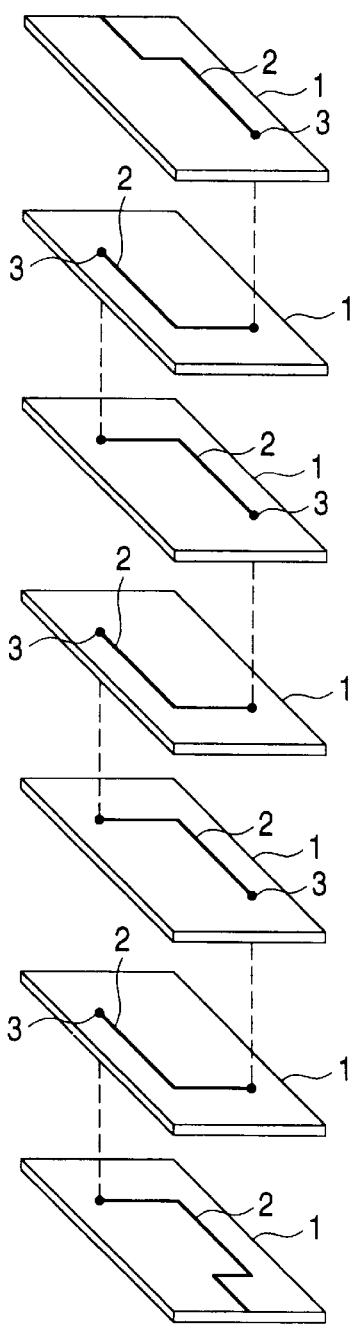
FIG. 10B
PRIOR ART
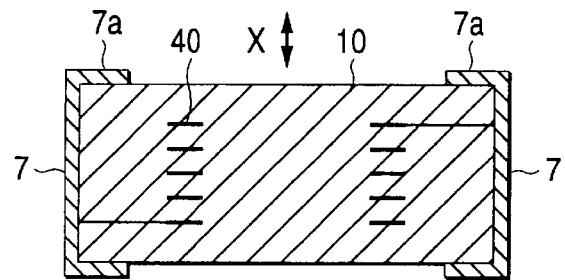
FIG. 10C
PRIOR ART
FIG. 10D
PRIOR ART
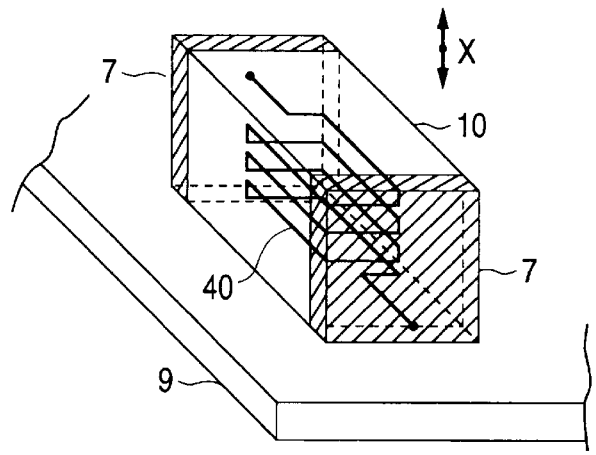
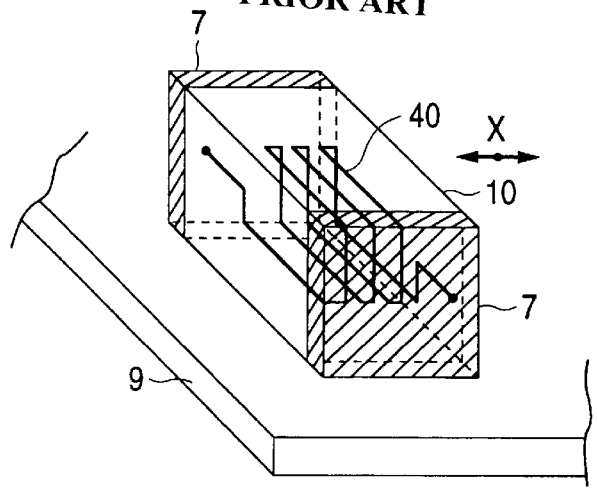

MULTILAYER ELECTRONIC PART WITH PLANAR TERMINAL ELECTRODES

BACKGROUND OF THE INVENTION

1. Field of the Invention

The present invention relates to a multilayer electronic part which composes an inductor formed by superposing coil conductors and magnetic or nonmagnetic material, and a filter, resonator etc. formed by interposing a capacitor on the inductor, and a producing method thereof.

2. Description of the Related Art

Conventional multilayer electronic parts are produced by the following manner. As shown in FIG. 10A illustrating a layer structure, sheets 1 which are made of a magnetic or nonmagnetic material and which each has a coil conductor 2 formed thereon and further has a through-hole 3 formed therein are superposed on one another. The resultant assemblage is burned and then cut into chips. As shown in FIG. 11A, these chips 4 are press-fitted into holes 5a formed in a supporting plate 5, e.g., a silicon plate, and then dipped on both sides into a silver paste 6. After these chips 4 are baked, they are electroplated with, e.g., nickel or tin to form terminal electrodes 7. In the thus-produced conventional electronic parts, the two terminal electrodes 7 are located respectively on both ends along a direction perpendicular to the direction X of the magnetic flux which generates when current is caused to flow through the coil 40, as shown in FIG. 10B. In addition, each terminal electrode 7 necessarily has a part 7a which extends beyond the edges and covers those parts of the sides which are located close to the end.

However, the electronic parts having the constitution described above have the following problem. When this electronic part 10 is mounted on a printed board 9, the resultant magnetic circuit including the printed board 9 changes in magnetic resistance and other properties depending on whether the electronic part 10 is mounted so that the direction of magnetic flux X is perpendicular to the plane of the printed board 9 as shown in FIG. 10C, or is mounted so that the direction of magnetic flux X is parallel to the plane of the printed board 9 as shown in FIG. 10D. This property change, attributable to the manner in which the electronic part 10 is mounted on the printed board 9, is remarkable especially when the electronic part 10 is used, e.g., as a small inductor for high frequencies which employs a material having a low permittivity.

In order to eliminate the problem described above, JP-A-8-55726 discloses an electronic part having terminal electrodes 7 which have been formed in a later step by dipping and are located respectively on both ends along the direction of the magnetic flux generating when current is caused to flow through the coil conductors in the multilayer structure, as shown in the sectional view of FIG. 11B and the slant view of FIG. 11C. (The term "JP-A" as used herein means an "unexamined Japanese patent publication".)

However, the multilayer electronic parts having terminal electrodes 7 formed in a post-step have the following problems. Since the distance L1 between the terminal electrodes 7 considerably fluctuates as shown in FIG. 1D, not only considerable property fluctuations and a poor yield result, but also the terminal electrodes 7 are apt to have defects such as a projection 7b called a horn. Because of such defects, the dimension L2 fluctuates. Consequently, when electronic parts 10 which have been stored in bulk are transported through a channel 11 having a width suitable for the dimension of the electronic parts 10, as shown in FIG. 11E, and mounted in a row, there are cases where some electronic parts 10 incline due to the presence of the projection 7b and are mounted in the inclined state on a printed board 9.

SUMMARY OF THE INVENTION

It is an object of the present invention to provide an electronic part which is reduced in property fluctuations when being mounted on a printed board, has improved accuracy with respect to the distance between the terminal electrodes thereof and to the dimension thereof to thereby attain an improved yield, and can be satisfactorily mounted after storage in bulk.

It is another object of the present invention is to provide a method for producing the electronic part.

A multilayer electronic part having the shape of a substantially rectangular parallelopiped, according to the present invention is comprised of coil conductors; sheets each comprising a magnetic or a nonmagnetic material, the coil conductors and the sheets being stacked to form a coil in the multilayer electronic part; and terminal electrodes provided on both ends of a multilayer body in which the coil conductors and the sheets are stacked along a direction of a magnetic flux generating when current is applied to flow through the coil conductors in the multilayer body, the terminal electrodes being formed of a conductive layer structure member of the multilayer body.

In the multilayer electronic part according to the present invention, the terminal electrode is formed on only both end surfaces of the multilayer structure and projects to the side surfaces. Accordingly, fluctuations in terminal electrode distance due to the protruded portions from the end surface to the side surface is eliminated. As the result, fluctuations in its property can be reduced. In addition, since the terminal electrode is a component of the conductive layer structure member of the lamination bodies, the multilayer electronic part is free from the projection generated in the dipping method, and is improved in dimensional accuracy. Further, in an automatic machine for mounting the electronic parts on printed boards or the like, they can be arranged in a row in a channel of the machine and can be mounted on the substrate without inclination.

In the producing method of the multilayer electronic parts according to the present invention, the terminal electrode is formed simultaneously with cutting the lamination bodies.

BRIEF DESCRIPTION OF THE DRAWINGS

In the accompanying drawings:

FIG. 1F shows results of reactance fluctuations in respective patterns;

FIG. 10A is a perspective view showing the multilayer body of a conventional electronic part;

FIG. 10B is a sectional view of FIG. 10A;

FIGS. 10C and 10D are perspective views each shows a condition where the mounting surface on a printed board of the conventional electronic part is changed;

DETAILED DESCRIPTION OF THE INVENTION

Detailed description of the present invention will be described as follow referring to the accompanying drawings.

Figure 1A:
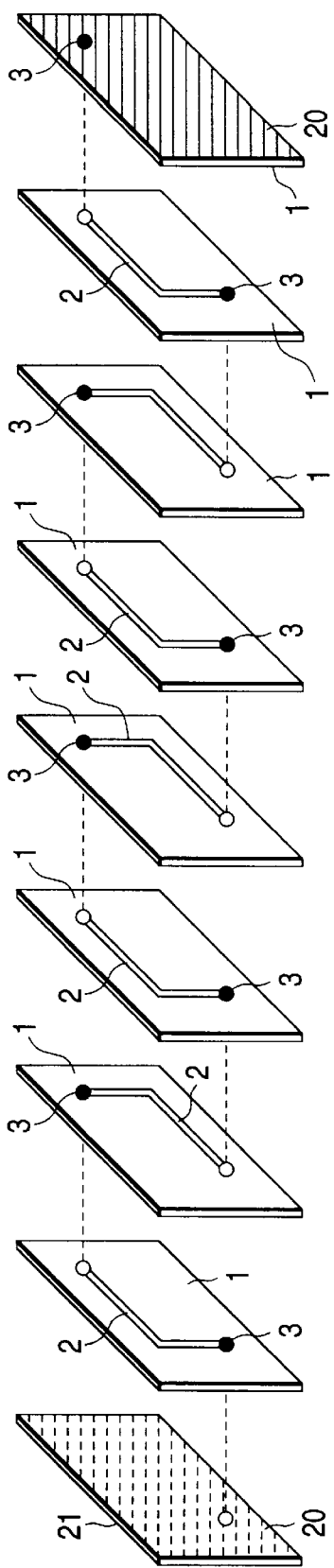
FIG. 1A is a perspective view illustrating a layer structure corresponding to one chip as one embodiment of the electronic part according to the present invention.
Figure 1E:
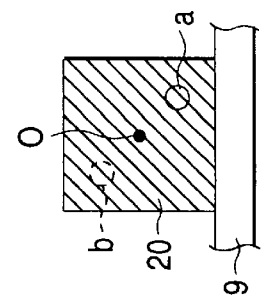
FIG. 1E is an plan view illustrating the electronic part mounted on a printed board using another side as a mounting side.
Figure 1D:
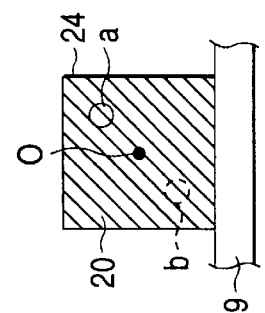
FIG. 1D is an plan view illustrating the electronic part mounted on a printed board.
Figure 1C:
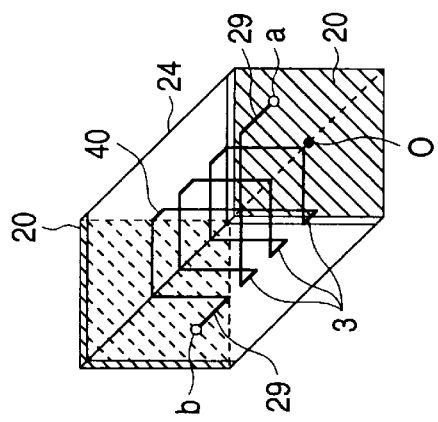
FIG. 1B and 1C respectively are a sectional view and a perspective view both illustrating the completed electronic part.
Figure 1B:
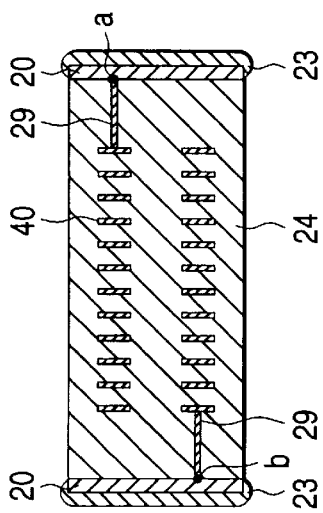
Figure 2:
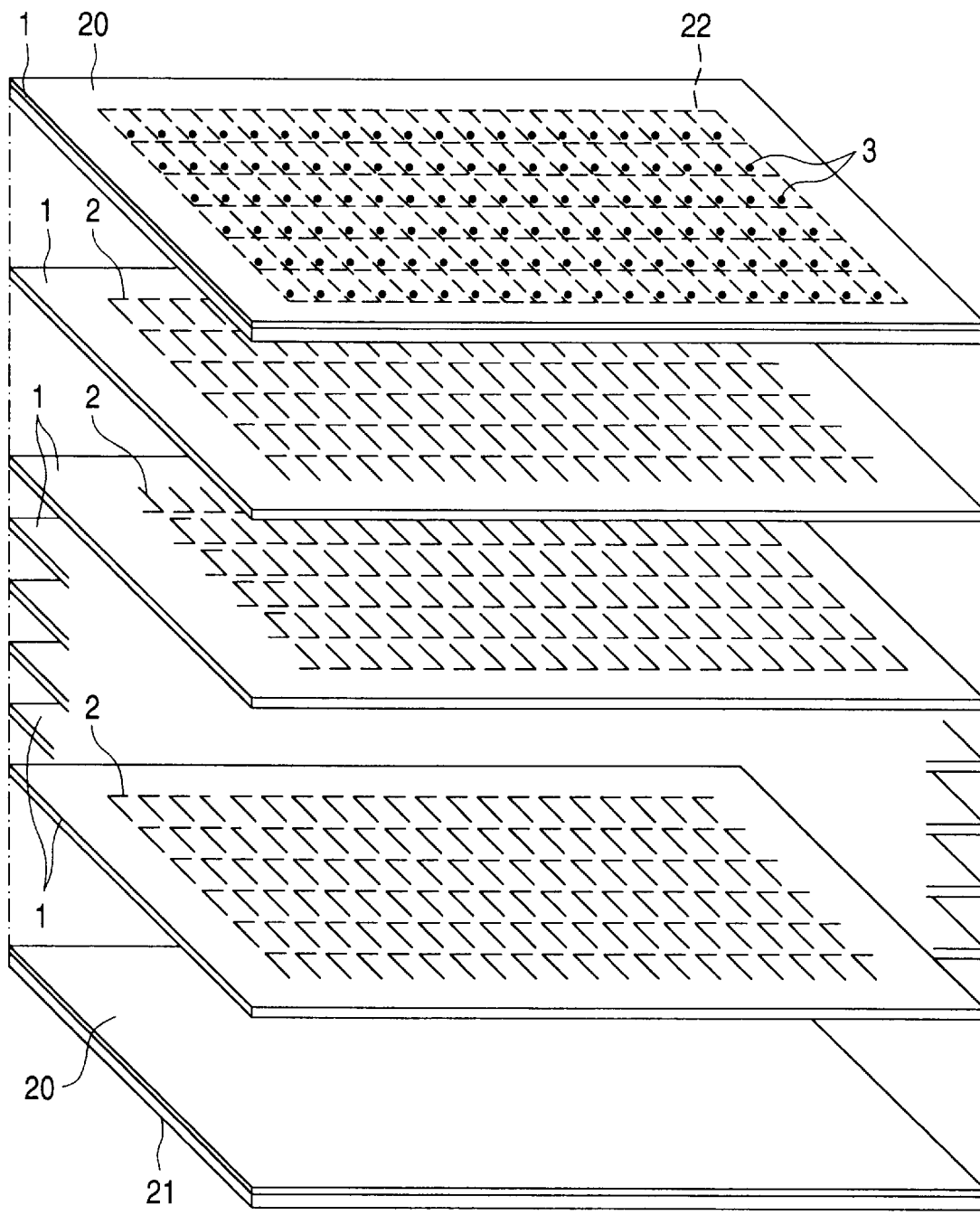
FIG. 2 is a perspective view illustrating a layer structure used for producing many chips of the above embodiment.
Figure 3A:
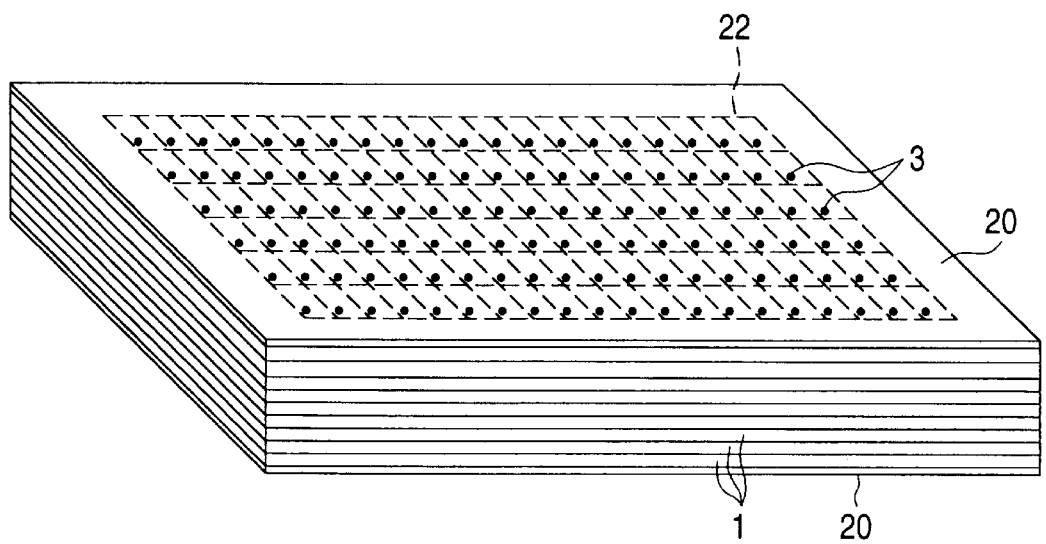
FIG. 3A is a perspective view illustrating an assembly composed of superposed sheets for the above embodiment.

FIG. 1A is a perspective view illustrating a layer structure corresponding to one chip as one embodiment of the electronic part according to the present invention. FIGS. 1B and 1C respectively are a sectional view and a perspective view both illustrating the completed electronic part, and FIG. 1D is an plan view illustrating the electronic part mounted on a printed board. FIG. 2 is a perspective view illustrating a layer structure used for producing many chips of this embodiment. FIG. 3A is a perspective view illustrating an assembly made up of superposed sheets. This embodiment of the electronic part, based on the layer structure shown in FIG. 1A, is produced as follows.

A coil conductor 2 made of a metal, e.g., silver or an alloy thereof, and having U-(¾ turn) or L-(½ turn) shape as shown in the drawing is formed by printing on each of green sheets 1 made of a nonmagnetic material having a low permittivity. A through-hole 3 is further formed in each of these green sheets 1, as shown in FIG. 1A, in order to connect an end of the coil conductor 2 of each green sheet 1 to an end of the coil conductor 2 of an adjacent green sheet 1. These through-holes 3 are filled with a conductive paste.

The green sheets 1 are preferably made of a material having a relative permittivity of 30 or lower from the standpoint of obtaining a reduced value of distributed capacitance suitable for high-frequency use. Examples of the material include alumina, cordierite, umlite, and low-permittivity glasses. For this embodiment, however, ceramic sheets are used which are made of a ceramic composition consisting of 70 wt % glass formed from strontium, calcium, alumina, and silicon oxide, and 30 wt % alumina. The coil conductors 2 each is formed by printing a pattern having a width of 60 $\mu$m and a thickness of 10 $\mu$m.

A metal foil for a terminal electrode 20 is provided on one of the outermost green sheets 1 in which a through-hole 3 is formed. A metal foil for a terminal electrode 20 and a strippable film 21 are superposed on the other outermost green sheet 1. The metal foil 20 is made of silver, silver-alloy, nickel or the like. There may be a case where one or more green sheets 1 each having only a through-hole 3 are interposed between the terminal electrode 20 made of the metal foil and the green sheet 1 having the coil conductor 2 or between the green sheet 1 having the terminal electrode 20 made of the metal foil and the green sheet 1 having the coil conductor 2.

Thus produced green sheets 1 and film 21 are stacked and press-fitted as shown in FIG. 3A. Thereafter, the film 21 is stripped off. The resultant assembly is cut along the broken lines 22 shown in FIGS. 2 and 3A and then burned to thereby obtain respective multilayer bodies 24. The coil conductors 2 on the respective layers are connected to each other by the conductor filled in the through holes 3, while as shown in FIGS. 1B and 1C, each end of the coil 40 is connected to the terminal electrode 20 through a leading conductor 29 in the through hole 3.

If necessary, after cutting into the respective chips, the terminal electrode 20 of each chip are electroplated, e.g., with copper, nickel and tin, with nickel and tin, or with nickel and tin-lead to thereby form a plating layer 23 made up of these components on each electrode 20, as shown in FIG. 1B.

According to the above-described steps of forming terminal electrodes 20, an electronic part can be realized in which the terminal electrodes 20 are located respectively on both ends along the direction of the magnetic flux generating when current is caused to flow through the plurality of coil conductors 2 in the multilayer body 24. In this constitution, the terminal electrode 20 is formed within the range of the end surface of the multilayer body 24. Consequently, the distance between the terminal electrodes 20 is defined by the width of the multilayer body 24. As a result, the fluctuations in the range covered with terminal electrodes which are caused, e.g., by the recession of a conductive paste as in the conventional dipping method are eliminated, whereby reduced property fluctuations and an enhanced yield are obtained.

Figure 11A:
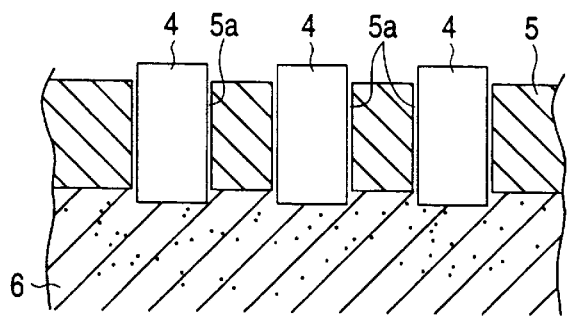
FIG. 11A is a sectional view showing a conventional terminal forming method.
Figure 11D:
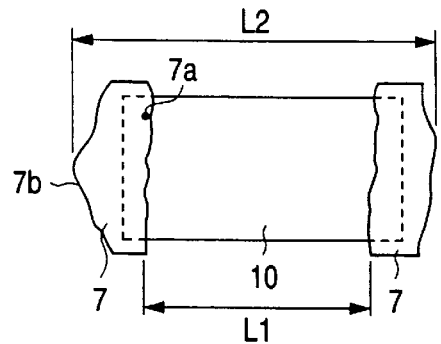
FIG. 11D is a side view detailing the fluctuations of sizes of conventional electronic parts.
Figure 11B:
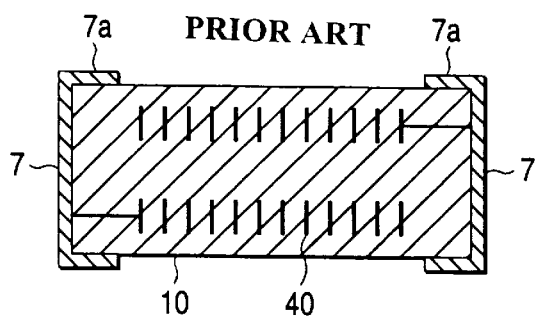
FIG. 11B is a sectional view of another example of the conventional electronic part.
Figure 11E:
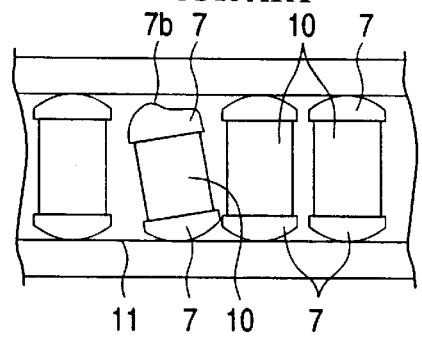
FIG. 11E a plan view showing an arrangement of the electronic parts in a channel.
Figure 11C:
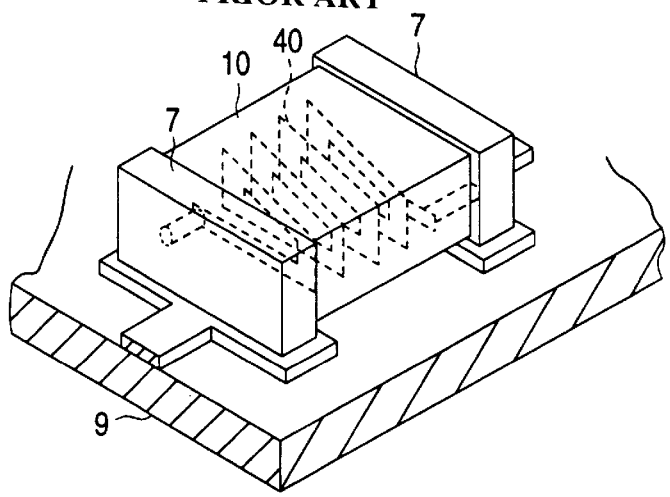
FIG. 11C is a perspective view of FIG. 11B.
Figure 11F:
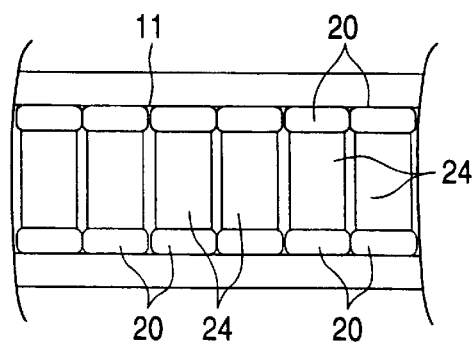
FIG. 11F is a plan view showing an arrangement of the electronic parts according to the present invention in a channel.

The terminal electrodes 20 is formed in the above stacking step or by stacking on the lamination body by printing or adhering after the stacking step. Therefore, the terminal electrodes 20 can be formed with good accuracy and the plating layers 23 each is as thin as about 5 μm and is free from a protrusion portions 7b formed in the conventional dipping method. Since electronic parts having the constitution described above have improved dimensional accuracy, they can be mounted in good order without inclination or positioning failure, after being stored in bulk and then arranged in a row in a channel 11 of an automatic mounting machine as shown in FIG. 11F.

In this embodiment, the multilayer body 24 has a square section perpendicular to the direction of the magnetic flux generated by the coil conductors 2, as shown in FIG. 1D. Consequently, even when any side of the multilayer body is directed to a printed board 9 in mounting the electronic part thereon, the distance between the axis of the magnetic flux and the printed board is almost constant, whereby the property fluctuations caused by differences in mounting side are reduced.

Furthermore, as shown in FIGS. 1C and 1D, the spiral initiation point "a" and the spiral termination point "b" of the coil 40 in the multilayer body 24 are located on a diagonal line in a rectangular section perpendicular to the direction of the magnetic flux, and the positions of the two points are symmetrical about the center O of these rectangular sections of the multilayer body 24. Consequently, even when another side of the multilayer body 24 is used as a mounting side as shown in FIG. 1E, the properties of the electronic part change little. There is hence no need of taking care of the selection of a mounting side, and easy mounting is possible.

An explanation on property fluctuations is given below. In the case of an inductor having the conventional structure shown in FIGS. 10B to 10D and having dimensions of 1.01 mm×1.0 mm×0.5 mm and a nominal inductance of 3.3 nH, use of different mounting sides in mounting on a printed board 9 resulted in a reactance change of 11.21% on the average. On the other hand, in the case of an electronic part having a structure according to the present invention in which the spiral initiation point "a" and the spiral termination point "b" of the coil conductors 2 each was located on a diagonal line, excluding the center thereof, in a rectangular section perpendicular to the direction of the magnetic flux and the points "a" and "b" were located in the same position when viewed from a direction parallel to the magnetic flux, use of different mounting sides resulted in a reactance change of 3.92% on the average. Namely, a considerable reduction in property fluctuations was attained, and it has become possible to conduct mounting without taking care of the selection of a mounting side. In the case of an electronic part according to the present invention in which the positions of the points "a" and "b" were symmetrical about the center O of the rectangular sections as shown in FIGS. 1D and 1E, use of different mounting sides resulted in a reactance change of 2.2%. Thus, an even greater reduction was attained in the property fluctuations caused by mounting side changes.

The spiral initiation point "a" and the spiral termination point "b" of the coil 40, that is, the positions of the leading conductors 29 were changed to various positions so as to examine the reactance fluctuations due to the change of their mounting positions. In this examination, fifty samples were used for respective positions. The results are indicated in FIG. 1F.

As apparent from FIG. 1F, in the case of "B" in which the positions "a" and "b" are located at the center, the fluctuation ratio ρ due to the change of the mounting surface is the smallest. Next, in the cases of "C" and "D" in which the positions "a" and "b" are located symmetrically about the center and located at the inside of the spiral portion of the coil, the variation ratio is small. However, in the case of "E" in which the positions "a" and "b" are located in the same place, the fluctuation ratio is twice as much as that of the case of "A" in which the positions "a" and "b" are located symmetrically and located near the corners. Thus, according to the positions or the relative positions of the positions "a" and "b", the fluctuation ratio of the reactance due to the change of the mounting surface is made larger as the change amount of the total of the distance between the mounting surface and the position "a" and the distance between the mounting surface and the position "b" due to the change of the mounting surface become larger.

Figure 3B:
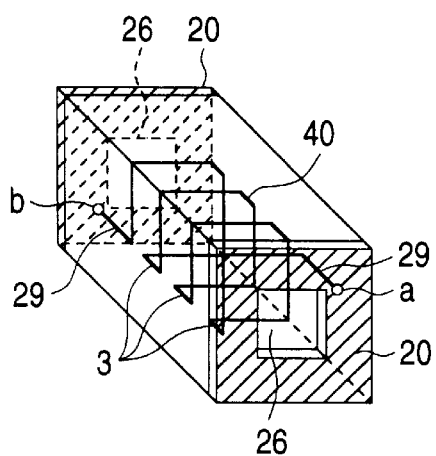
FIG. 3B is a perspective view illustrating another embodiment of the electronic part according to the present invention.

FIG. 3B shows another embodiment of the electronic part according to the present invention. In this embodiment, each end having a terminal electrode 20 has an area 26 where the terminal electrode 20 is not formed at the center thereof. According to this embodiment, an inductor or a resonator is obtained which has properties more similar to those of air-core coils due to the areas 26 where the terminal electrodes 20 have not been formed.

Figure 4A:
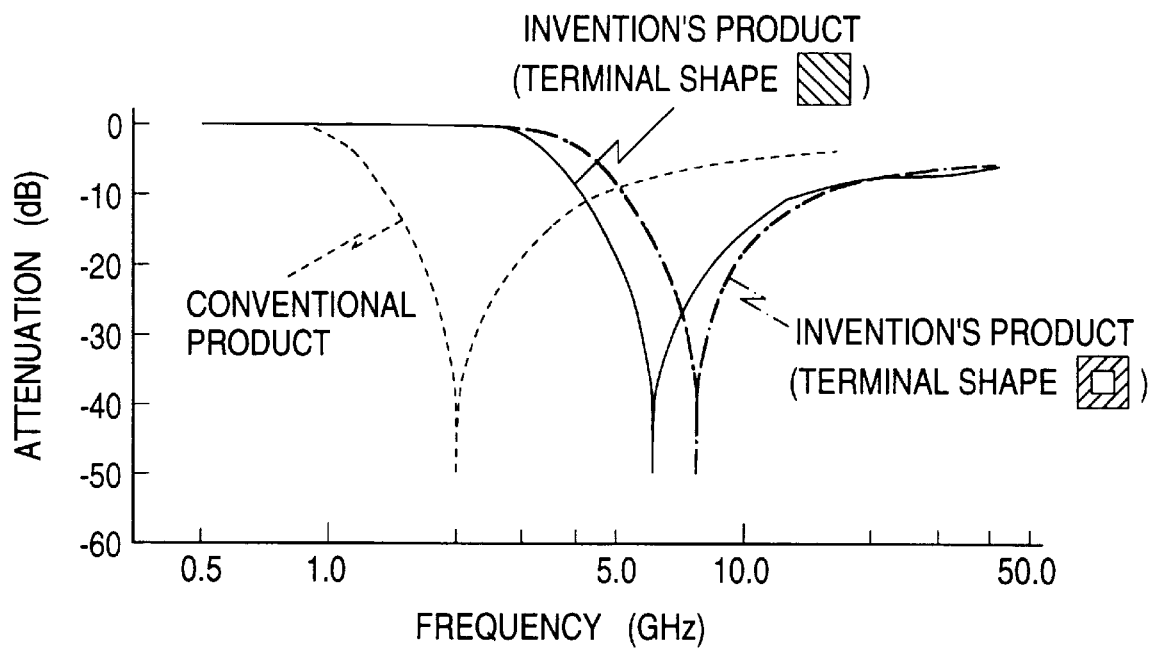
FIG. 4A shows the frequency characteristics of a conventional inductor and of inductors as embodiments of the electronic part according to the present invention.

FIG. 4A shows the relationship between distributed capacitance and self-resonant frequency in a conventional inductor having terminal electrodes 7 respectively on both ends along a direction perpendicular to the direction of the magnetic flux as shown in FIG. 10, an inductor as an embodiment of the present invention having terminal electrodes 25 over the whole surfaces of both ends along the direction of the magnetic flux as shown in FIGS. 1B and 1C, and an inductor as another embodiment of the present invention having on each end the area 26 where the terminal electrode 20 has not been formed as shown in FIG. 3B; the three inductors each has a nominal inductance of 33.0 nH. The conventional inductor, the embodiment shown in FIGS. 1B and 1C, and the embodiment shown in FIG. 3B had self-resonant frequencies of about 2.0 GHz, about 6.4 GHz, and about 7.8 GHz, respectively. These results demonstrated that an inductor or a resonator suitable for higher frequencies can be realized according to the present invention. The embodiment shown in FIG. 3B was found to be especially suitable for high frequencies.

Figure 5:
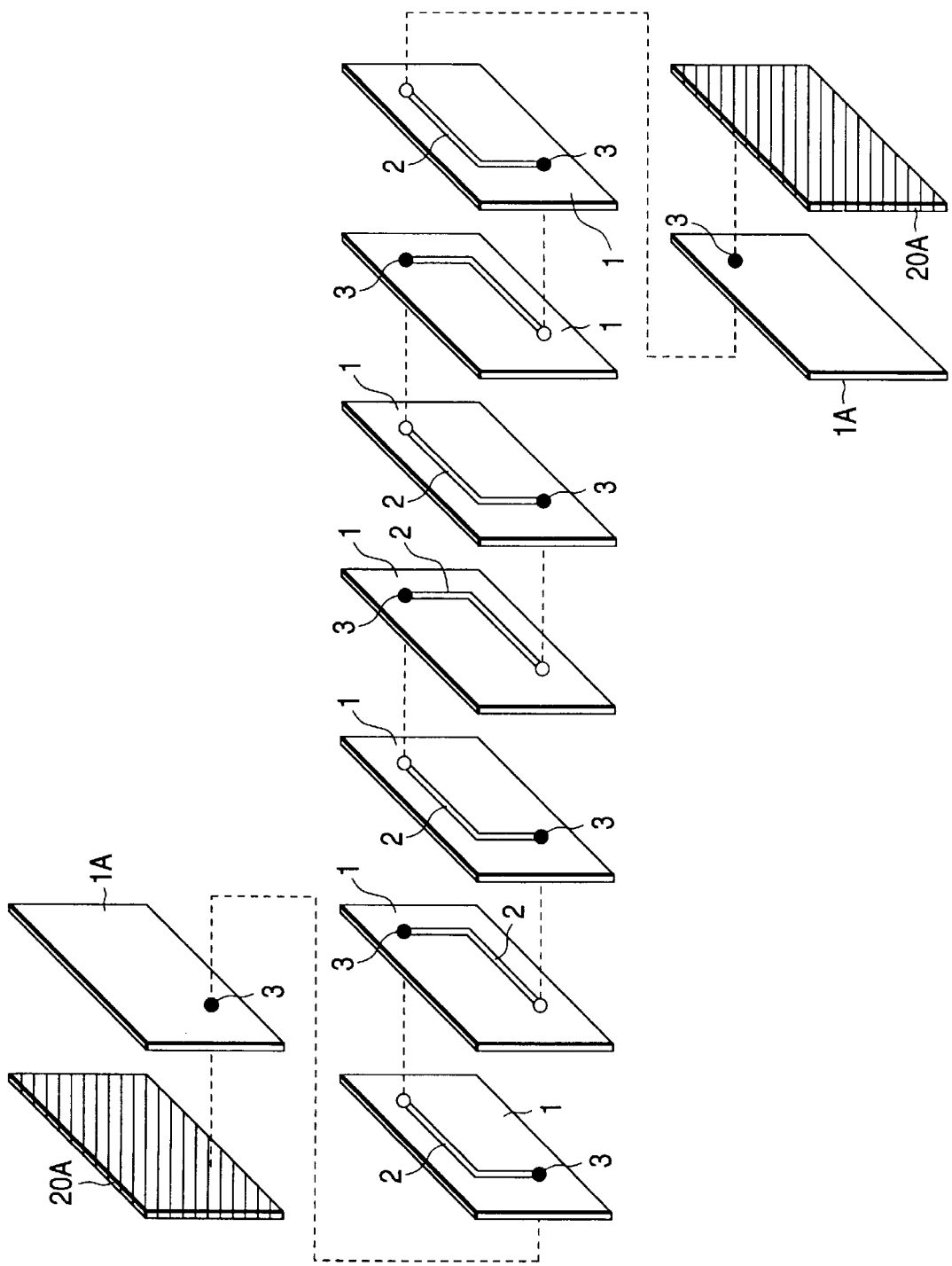
FIG. 5 is a perspective view illustrating a layer structure corresponding to one chip as still another embodiment of the electronic part according to the present invention.
Figure 6:
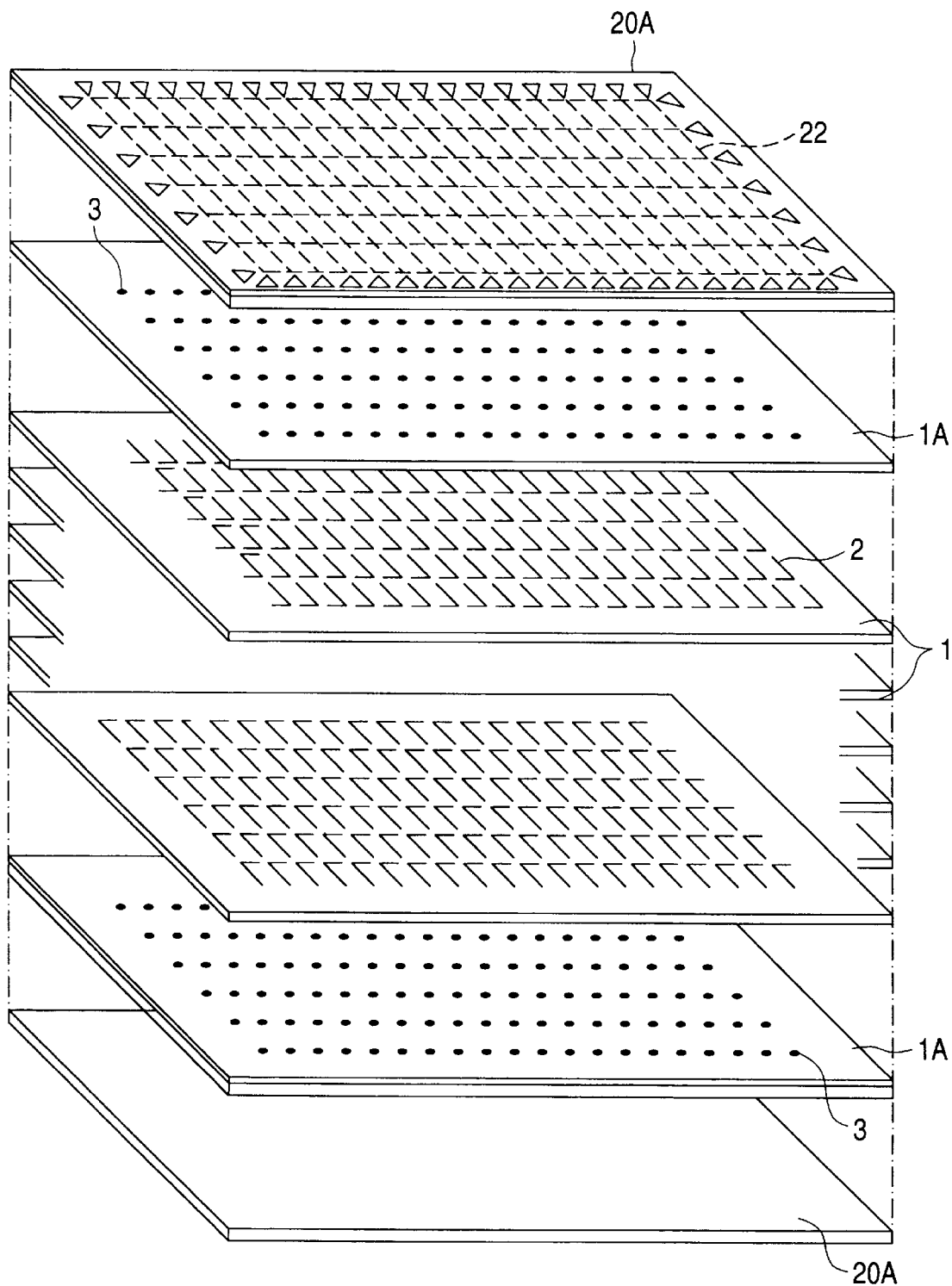
FIG. 6 is a perspective view illustrating a layer structure used for producing many chips of the embodiment of FIG. 5.

FIG. 5 shows still another embodiment according to the present invention of the one-chip multilayer body. In this embodiment, a conductive green sheet 20A is used as shown in FIG. 6 so that the terminal electrode 20 is integrally formed as a part of a sintered multilayer body. The conductive green sheet 20A was formed into a film in such a manner that 16.7 vol % of silver powder as conductor powder, 18.8 vol % of glass powder as insulator powder and 64.5 vol % of vehicle were mixed with a synthetic resin binder so that the thickness after sintering became 120 μm.

Preferably, the content of the silver powder as conductive powder is in the range of 7.20 vol % to 24.47 vol %, that of the glass powder as insulation powder is in the range of 0.49 vol % to 43.97 vol % and that of the vehicle is in the range of 48.83 vol % to 75.94 vol %.

More preferably, the content of the silver powder as conductive powder is in the range of 10.61 vol % to 20.20 vol %, that of the glass powder as insulator powder is in the range of 11.22 vol % to 35.37 vol %, and that of the vehicle is in the range of 54.02 vol % to 68.58 vol %.

Incidentally, the composition after sintering of the conductive sheet became 47.0 vol % of silver and 53.0 vol % of glass as insulator. One or more sheets 1A having only the through hole 3 in which a coil leading conductor is filled are stacked between the conductive green sheet 20A and the coil conductor 2.

Thus produced conductive green sheet 20A and sheets 1, 1A are stacked and press-fitted, and after cutting into respective chips, they are sintered.

Subsequently, the terminal electrode 20 of each chip are electroplated, e.g., with copper, nickel and tin, with nickel and tin, or with nickel and tin-lead to thereby form a plating layer 23 made up of these components on each electrode 20, as shown in FIG. 1B.

With respect to the outer dimensions of the electronic parts in FIGS. 5 and 6 of the embodiments of the invention and that of the electronic parts produced by conventional dipping method, the length in the opposite direction of the terminal electrodes 20 of respective parts were compared with each other. As the results, in the conventional ones, the average of the length was 0.5286 mm and ρ (dispersion) was 0.0072 mm, and on the other hand, in this embodiment, the average of the length was 0.5271 and ρ (dispersion) was 0.0041 mm. Accordingly, the present invention can remarkably reduce the fluctuation of the dimension.

Concerning to a conventional electronic part having a protrusion portion 7a wherein the terminal electrode is produced by dipping method after sintering a cut chip, another conventional electronic part having no protrusion portion 7a wherein the terminal electrode is produced preciously in dimension by dipping method after sintering a cut chip, and the electronic part according to the present invention, the flexible strengths were measured and compared with each other. With respect to the flexible strength, after soldering a sample on the test board, a load was mechanically applied from the back of the test board, and the flexible strength was defined the amount of the flexed amount of the test board when the sample was broken.

Figure 7:
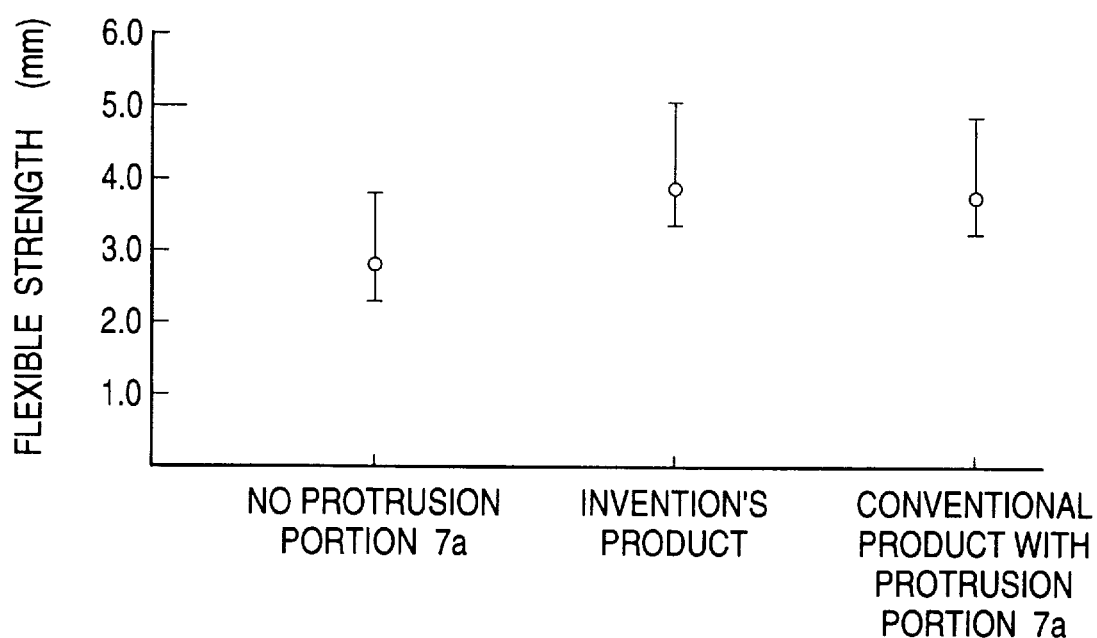
FIG. 7 is a graph showing test results of the comparison of the flexible strengths of the electronic part according to the invention and the electronic parts produced by the conventional dipping method.

The measurement results of the flexible strength is shown in FIG. 7. As seen from FIG. 7, in the case of the embodiment of the present invention, that is, constituting the terminal electrode 20 as the sintered lamination body by stacking and sintering the conductive sheets, the thickness of the conductive sheets serves as the protrusion portion 7a. Therefore, its flexible strength apparently increases in comparison with the conventional one having no protrusion portion 7a, and is similar to that of the conventional one having the protrusion portion 7a.

Incidentally, in the embodiments as shown in FIGS. 5 and 6, Ag, Ag-alloy, Au, Pt, V, etc. is used alone or in a combination of two or more as the conductor powder for producing sheet 20A. As the insulator powder in the sheet 20A, in addition to the above examples, oxide of Zn, Pb, Si, B, Bi, Mn, Y etc. is used alone or in a combination of two or more as the insulator powder.

Figure 3C:
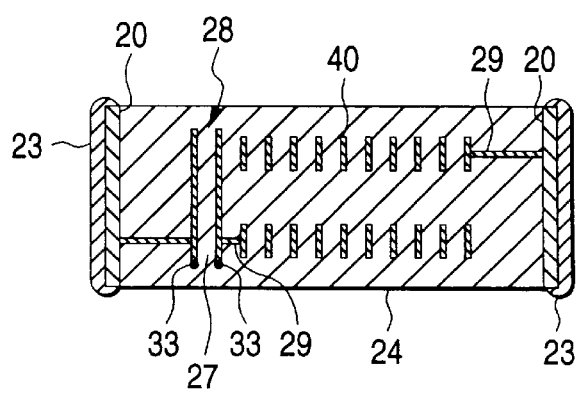
FIG. 3C is a sectional view illustrating still another embodiment of the electronic part according to the present invention.

As shown in FIG. 3C, the present invention can be applied to a case where opposite electrodes 33 are provided through a dielectric body 27 in the multilayer body so as to form a capacitor 28 and the capacitor 28 is connected in serial to the coil 40 to form a resonator etc. Incidentally, according to the present invention, it is possible to realize a structure in which a plurality of coils are connected to the built-in capacitor.

Figure 4B:
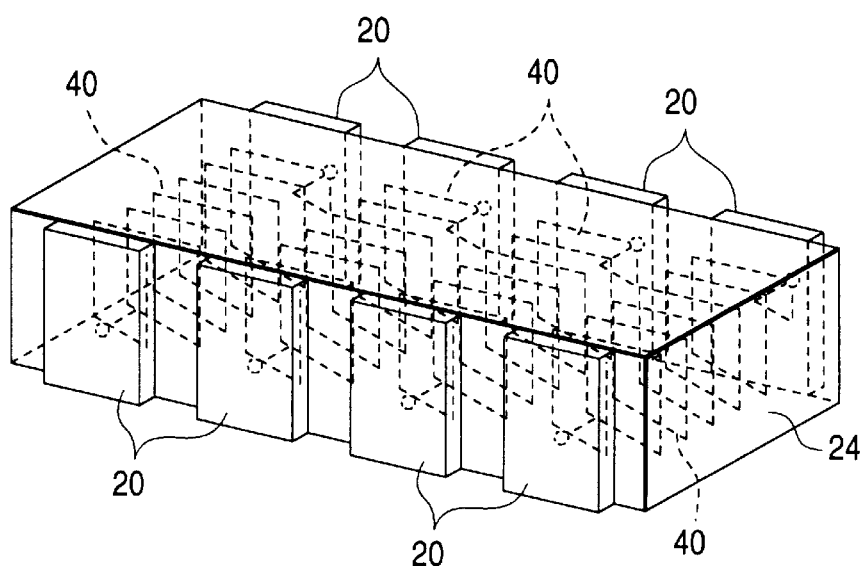
FIG. 4B is a perspective view illustrating a further embodiment of the electronic part according to the present invention.
Figure 4C:
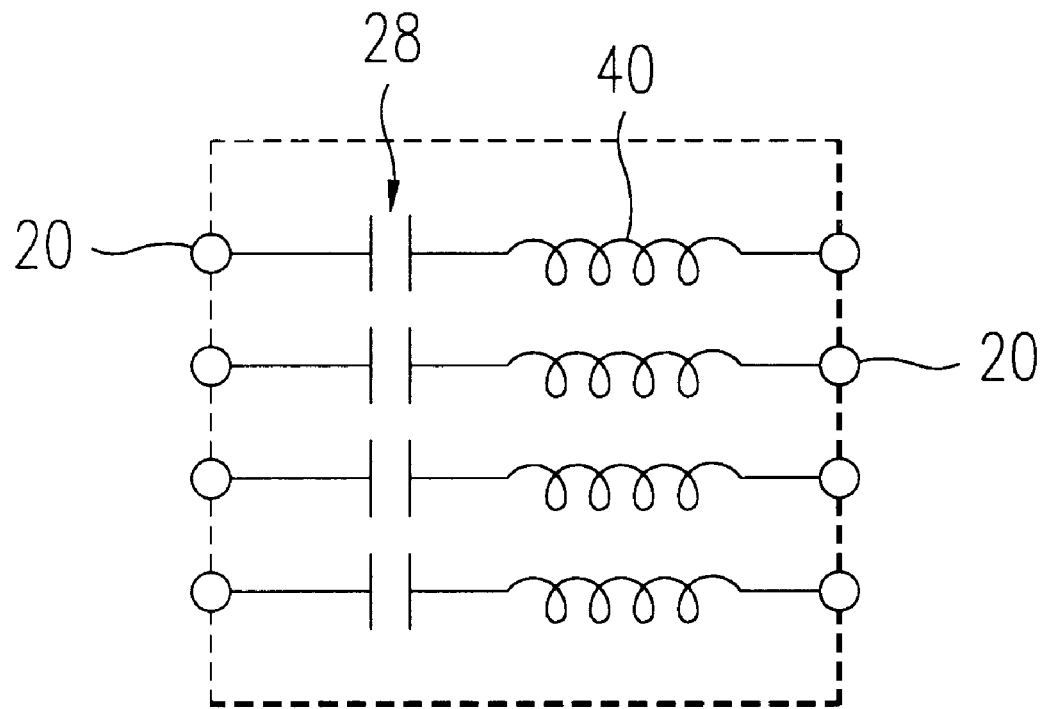
FIG. 4C is a circuit diagram of the electronic part according to the present invention.

A further embodiment of the electronic part according to the present invention is shown in FIG. 4B. In this embodiment, a multilayer body 24 has therein two or more sets of coil 40 arranged in a row. Both ends of each set of coil 40 are connected to respective terminal electrodes 20 formed on both ends of the multilayer body. In this case also, the effects of improving dimensional accuracy and reducing property fluctuations can be obtained. Furthermore, inductors having this constitution necessitate a smaller mounting space than the same number of inductors separately fabricated. The structure shown in FIG. 4B can be modified so as to contain one or more built-in capacitors as in the structure shown in FIG. 3C. A circuit diagram of the electronic part according to the present invention when the structure shown in FIG. 4b is combined with the capacitor, such as shown in FIG. 3c, is illustrated. A capacitor 28 is disposed between a terminal electrode 20 and coil 40.

Figure 8A:
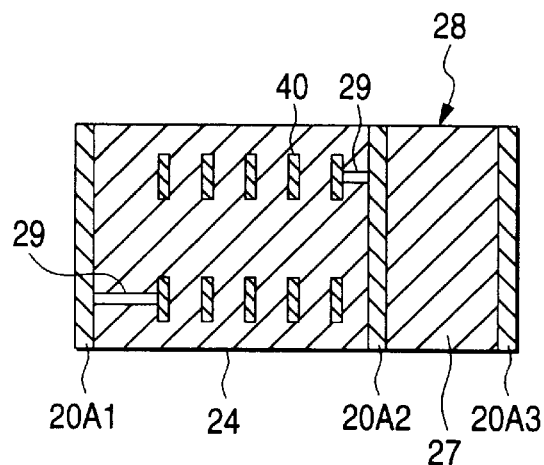
FIG. 8A is a sectional view showing still another embodiment according to the present invention.

FIG. 8(A) shows still another embodiment of the present invention. The dielectric body 27 and the intermediate terminal electrode 20A2 whose periphery exposes to the outer periphery of the multilayer body 24 are interposed between one of the leading conductor 29 and the terminal electrode 20A3. Thus, the capacitor 28 can be composed of the intermediate electrode 20A2, the terminal electrode 20A3 and the dielectric body 27. The intermediate terminal electrode 20A2 has a surface perpendicular to the flux direction generated in the coil 40.

Figure 8B:
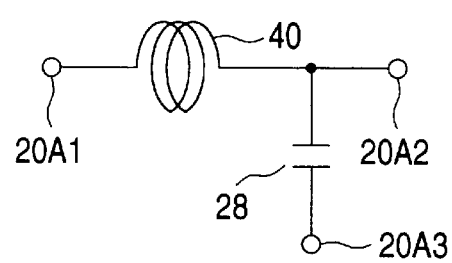
FIG. 8B shows an equivalent circuit of the embodiment of FIG. 8A.

As shown in FIG. 8B, it is possible that the terminal electrode 20A1 and the intermediate terminal electrode 20A2 are served as input and output terminal and the terminal electrode 20A3 is served as a ground terminal so that the part shown in FIG. 8A can be used as an L-type filter.

In the structure of FIG. 8A, for example, in addition to the green sheets on which the coil conductor 2 is printed, the green sheet 1A having the through hole 3 and the terminal electrode conductive green sheet 20A as shown in FIG. 6, a lamination sheet portion for forming a capacitor consisting of a conductor green sheet for forming the capacitor electrode (intermediate terminal electrode 20A2) and a green sheet for forming the dielectric body 27 is provided between the green sheet 1A having the through hole 3 and one of the upper and bottom terminal electrode conductive green sheets 20A. Then, whole of the green sheets are press-fitted. The cutting and sintering steps are the same as described above. In this case, if necessary, the terminal electrode 20A2 exposing to the side surface is plated as well as the both end terminal electrodes 20A1 and 20A3.

Figure 8C:
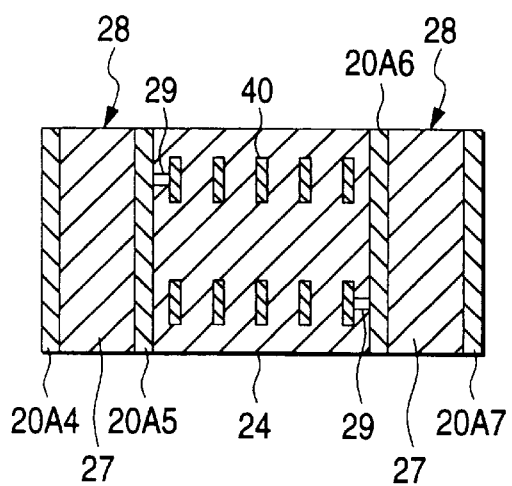
FIG. 8C is a sectional view showing still another embodiment.
Figure 8D:
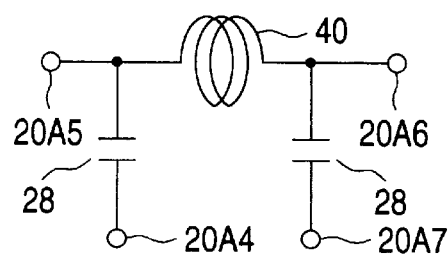
FIG. 8D shows an equivalent circuit of the embodiment of FIG. 8C.

Further, FIG. 8C is a sectional view and FIG. 8D shows an equivalent circuit of this embodiment. In this embodiment, intermediate terminal electrodes 20A5 and 20A6 are provided at both ends of the coil 40 respectively between the terminal electrodes 20A4 and 20A7 which are placed at both ends of the multilayer body 24. The dielectric bodies 27 are provided between the intermediate terminal electrodes 20A5 and 20A6 and the terminal electrodes 20A4 and 20A6, respectively. Thus, the capacitor 28 is formed to compose a π-type filter circuit.

Figure 9A:
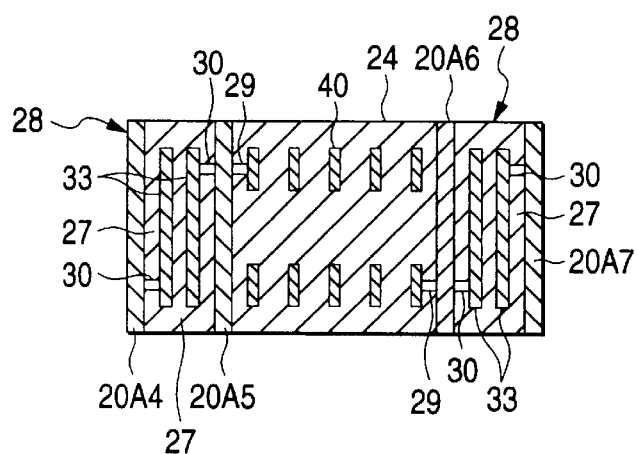
FIG. 9A is a sectional view showing still another embodiment according to the present invention.
Figure 9B:
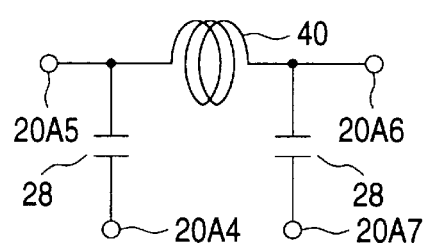
FIG. 9B shows an equivalent circuit of the embodiment of FIG. 9A.

Moreover, FIG. 9A is a sectional view showing still another embodiment according to the present invention, and FIG. 9B shows an equivalent circuit thereof. Two pairs of electrodes 33 are provided between the terminal electrode 20A4 and the intermediate terminal electrode 20A5 and between the terminal electrode 20A7 and the intermediate terminal electrode 20A6. The electrodes 33 are respectively connected to terminal electrodes 20A4 to 20A7 through the leading conductors 30.

In this case, the distance between the capacitor electrodes 33, 33 and the area of the electrodes 33, 33 are designed so as to set a desirable value of the capacitance of the capacitor 28. Accordingly, filters and resonators having various properties can be produced without changing the chip size. Incidentally, this structure in which the internal electrodes 33 of the capacitor is provided between the terminal electrodes can be applied to the case where the capacitor 28 is provided at only one end portion as shown in FIG. 8A.

Figure 9C:
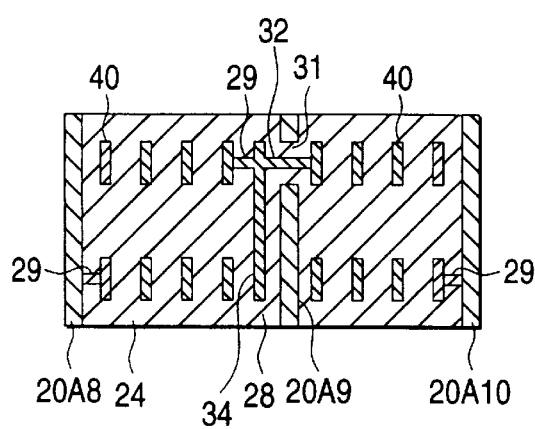
FIG. 9C is a sectional view showing still another embodiment.
Figure 9D:
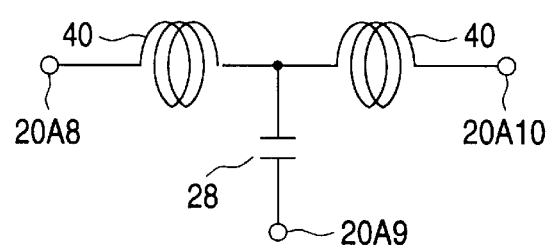
FIG. 9D shows an equivalent circuit of the embodiment of FIG. 9C.

FIG. 9C is a sectional view showing still another embodiment according to the present invention, and FIG. 9D shows an equivalent circuit thereof. In this embodiment, an intermediate terminal electrode 20A9 is provided between terminal electrodes 20A8 and 20A10, and coils 40, 40 are provided at both sides of the intermediate terminal electrode 20A9. At one end of one of the coils 40, an internal electrode 34 constituting the capacitor 28 is provided so as to opposite to the intermediate terminal electrode 20A9. The internal electrode 34 and one of the coils 40 are connected through the leading conductor 29. The internal electrode 34 is connected to the other electrode 40 through a penetration conductor portion 32 provided in a non-conductor portion 31, which is formed by penetrating the intermediate terminal electrode 20A9 as a hole. In this embodiment, a T-type filter as shown in FIG. 9D is structured.

In the present invention, in order to obtain an electronic parts enhancing inductance, a magnetic element such as ferrite is used for the sheet 1. Further, the present invention can realize the multilayer body by not only sheet method but also printing method.

In the present invention, the leading out positions 29 as shown in FIG. 1F, that is, the relative position of the spiral initiation portion "a" and the spiral termination portion "b" can be applied to the case where the coil 40 is connected to the capacitor 28 and the other coil 40 in the multilayer body.

What is claimed is:

1. A multilayer electronic structure in the shape of a substantially rectangular parallelopiped, comprising:

a first plurality of stacked sheets consisting of two coilless substantially planar end sheets and a second plurality of coil containing sheets wherein each of said second plurality of sheets includes a coil conductor and wherein said second plurality of stacked sheets form a coil with said two end sheets forming respective first and second terminal electrodes wherein the direction of stacking of said first plurality of sheets is along a direction of a magnetic flux generated when current is applied to flow through said coil conductors and wherein said stacked first plurality of sheets form a multilayer body.

2. A multilayer electronic part according to claim 1, further comprising at least one capacitor portion comprising a capacitor electrode and a dielectric body;
wherein said multilayer body and said capacitor portion are continuously stacked lengthwise.

3. A multilayer electronic part according to claim 1, further comprising at least one intermediate terminal electrode forming a plane perpendicular to the direction of the magnetic flux, a periphery of said intermediate terminal electrode exposing to an outer periphery of said multilayer body.

4. A multilayer electronic part according to claim 3, wherein the intermediate terminal electrode is served also as a capacitor electrode.

5. A multilayer electronic part according to claim 3, further comprising:
a non-conductive part provided in the intermediate terminal electrode; and
a penetration conductive portion provided in said non-conductive part, for connecting conductive parts of opposite sides of said intermediate terminal electrode.

6. A multilayer electronic part according to claim 1, wherein said multilayer body has a square section which is perpendicular to the direction of the magnetic flux.

7. A multilayer electronic part according to claim 1, wherein a spiral initiation point and a spiral termination point of said coil conductors in said multilayer body are located on a center of a rectangular section perpendicular to the magnetic flux direction.

8. A multilayer electronic part according to claim 1, further comprising: a plurality of coils arranged lengthwise in said multilayer body; wherein said terminal electrodes are connected directly or through a capacitor to each of said coils.

9. A multilayer electronic part according to claim 1, wherein said terminal electrodes are plated.

10. A multilayer electronic part according to claim 1, wherein a spiral initiation point and a spiral termination point of said coil conductors in said multilayer body are located on positions symmetrical to each other about a center.

\* \* \* \* \*